(12) United States Patent
Chen et al.

(10) Patent No.: US 7,505,195 B2
(45) Date of Patent: Mar. 17, 2009

(54) REFLECTIVE SPATIAL LIGHT MODULATOR WITH HIGH STIFFNESS TORSION SPRING HINGE

(75) Inventors: Dongmin Chen, Saratoga, CA (US); Tore Nauta, Menlo Park, CA (US)

(73) Assignee: Miradia Inc., Sunnyvale, CA (US)

( * ) Notice: Subject to any disclaimer, the term of this patent is extended or adjusted under 35 U.S.C. 154(b) by 273 days.

(21) Appl. No.: 11/418,941

(22) Filed: May 4, 2006

(65) Prior Publication Data
US 2007/0258130 A1   Nov. 8, 2007

(51) Int. Cl.
*G02B 26/00* (2006.01)
(52) U.S. Cl. ..................... 359/291; 359/290
(58) Field of Classification Search ........... 359/291, 359/290, 292, 295, 223, 224
See application file for complete search history.

(56) References Cited

U.S. PATENT DOCUMENTS

| | | | |
|---|---|---|---|
| 5,392,151 A | 2/1995 | Nelson | |
| 6,744,550 B2 * | 6/2004 | Neukermans et al. | 359/291 |
| 7,022,245 B2 | 4/2006 | Pan et al. | |
| 7,118,234 B2 | 10/2006 | Pan et al. | |
| 7,382,513 B2 | 6/2008 | Yang | |
| 2002/0186449 A1 | 12/2002 | Anderson et al. | |
| 2003/0103717 A1 | 6/2003 | Aksyuk et al. | |
| 2007/0097487 A1 * | 5/2007 | Yang et al. | 359/291 |
| 2007/0258124 A1 | 11/2007 | Chen et al. | |

FOREIGN PATENT DOCUMENTS

WO   WO 03/079090 A1   9/2003

OTHER PUBLICATIONS

International Search Report and Written Opinion of PCT Application No. PCT/US07/68243, mailed Sep. 12, 2008, 6 pages total.

* cited by examiner

*Primary Examiner*—Timothy J Thompson
(74) *Attorney, Agent, or Firm*—Townsend and Townsend and Crew LLP

(57) ABSTRACT

A spatial light modulator for use in display applications. The spatial light modulator includes a support substrate and a flexible member coupled to the support substrate. The spatial light modulator also includes a mirror plate coupled to the flexible member and characterized by an activated position. The mirror plate is adapted to rotate in relation to the flexible member from the activated position to a second activated position in a time less than 6.0 µs.

20 Claims, 8 Drawing Sheets

FIG. 3A   FIG. 3B   FIG. 3C

(time = $t_0$)

(time = $t_{11}$)

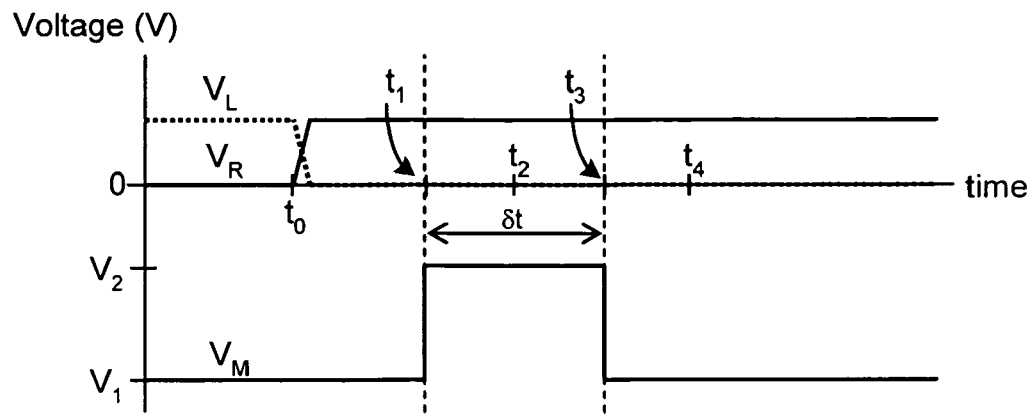
FIG. 5A
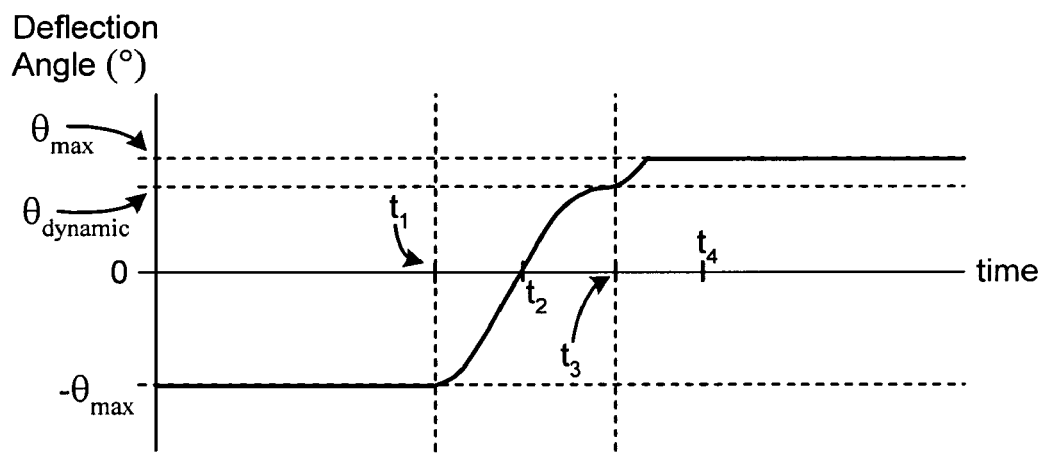
FIG. 5B
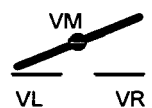
(time = $t_0$)
(time = $t_2$)
(time = $t_3$)
(time = $t_4$)
FIG. 5C  FIG. 5D  FIG. 5E  FIG. 5F

REFLECTIVE SPATIAL LIGHT MODULATOR WITH HIGH STIFFNESS TORSION SPRING HINGE

CROSS-REFERENCES TO RELATED APPLICATIONS

The following two regular U.S. patent applications (including this one) are being filed concurrently, and the entire disclosure of the other application is incorporated by reference into this application for all purposes:
application Ser. No. 11/418,941, filed May 4, 2006, entitled "Reflective Spatial Light Modulator With High Stiffness Torsion Spring Hinge"; and
application Ser. No. 11/429,376, filed May 4, 2006, now Pat. No. 7,443,568, entitled "Method and System for Resonant Operation of a Reflective Spatial Light Modulator".

BACKGROUND OF THE INVENTION

This present invention relates generally to spatial light modulators. More particularly, the invention relates to a method and structure for fabricating and/or operating a spatial light modulator with a high stiffness torsion spring hinge. Merely by way of example, the invention has been applied to initializing the micro-mirrors of a spatial light modulator using a resonant activation process. Additionally, the invention has been applied to a method of operating a spatial light modulator in a display application using a dynamic switching mode. The method and structure can be applied to spatial light modulators as well as other devices, for example, micro-electromechanical sensors, detectors, and displays.

Spatial light modulators (SLMs) have numerous applications in the areas of optical information processing, projection displays, video and graphics monitors, televisions, and electrophotographic printing. Reflective SLMs are devices that modulate incident light in a spatial pattern to reflect an image corresponding to an electrical or optical input. The incident light may be modulated in phase, intensity, polarization, or deflection direction. A reflective SLM is typically comprised of an area or two-dimensional array of addressable picture elements (pixels) capable of reflecting incident light.

Stiction is a common problem encountered in contacting MEMS devices such as spatial light modulators. A micro-mirror light modulator is one example which in operation switches rapidly between two rotated position (on and off). The micro-mirror is typically supported by a torsion spring hinge and actuated by a bias voltage applied between the mirror and one of two electrodes (for a binary mirror). The electrode drive force is attractive and the micro-mirror is typically stopped by a landing pad or post. The force (torque) of the torsion spring will restore the mirror to its equilibrium (un-rotated) position when the bias voltage is removed or reduced.

An adhesion force occurs when the micro-mirror contacts the landing pad, know as the stiction force. The origin of the stiction force typically arises from capillary force, electrostatic force due to contact potential or dielectric, and Van Der Walls force. The relative contribution of these three components depends on the geometry of the contact as well as the materials of the contact and the environment the device is operating in. Thus stiction is a complex problem. When the stiction force equals and exceeds the restoring force of the torsion hinge, the micro-mirror will stick to the landing pad and causes failure of the device. When the stiction force varies in time (due to charging for example) it will affect the dynamic performance of the mirror, such as its switching speed.

A number of solutions have been applied to reduce the stiction of a MEMS device. A typical example is to apply a molecular layer on the interfaces to reduce the adhesion force between the contacting surfaces. Coating of some type of SAM molecules to convert the surface to be hydrophobic is one method that effectively reduces the capillary force between the contacting surfaces. In alternate methods of the prior art, a stiff landing spring is added as a landing pad, in addition to the torsion hinge of the mirror. An overdrive pulse is applied to actuate the landing spring (bending mode) which will then bounce the micro-mirror away from the contacting point (landing pad) and the torsion spring will restore the mirror to its non-rotated position. A combination of two or more anti-stiction solutions are often employed to improve the device performance as well as its reliability.

In principle, so long as the restoring force and the torsion spring force ($F_{hinge}$) is greater than the stiction force ($F_{stiction}$) then the device should function properly. To increase the stiffness of the torsion spring, one can increase its cross-section and reduce its length. This approach is particularly applicable for a torsion spring hinge made of materials with high Young's modulus and yield stress. A single crystalline silicon hinge is ideal for implementing this concept as its Young's modulus is more than twice that of aluminum and its yield stress, more than ten times that of aluminum.

Solving the stiction problem with high stiffness torsion spring might appear to be the simplest solution. In general it also improves performance (by increasing the resonant frequency) and the manufacturability of the device. However, there are undesirable consequences of a stiff hinge. First, it requires higher actuation voltage to pull down or switch the micro-mirror. Second, the high actuation voltage will lead to more acceleration of the micro-mirror during switching and hence more impact of the micro-mirror on the landing pad, which will accelerate the wear and increase the stiction.

Thus there is a need in the art for methods and systems to overcome these drawbacks and to allow a practical implementation for using stiff torsion springs to overcome stiction forces and improve long term reliability in a MEMS device.

SUMMARY OF THE INVENTION

According to the present invention, techniques related to spatial light modulators are provided. More particularly, the invention relates to a method and structure for fabricating and/or operating a spatial light modulator with a high stiffness torsion spring hinge. Merely by way of example, the invention has been applied to initializing the micro-mirrors of a spatial light modulator using a resonant activation process. Additionally, the invention has been applied to a method of operating a spatial light modulator in a display application using a dynamic switching mode. The method and structure can be applied to spatial light modulators as well as other devices, for example, micro-electromechanical sensors, detectors, and displays.

According to an embodiment of the present invention, a spatial light modulator for use in display applications is provided. The spatial light modulator includes a support substrate and a flexible member coupled to the support substrate. The spatial light modulator also includes a mirror plate coupled to the flexible member and characterized by a first activated position. The flexible member is adapted such that the mirror plate is operative to rotate from the first activated position to a second activated position in a time less than 6.0 µs.

According to another embodiment of the present invention, a spatial light modulator for use in display applications is provided. The spatial light modulator includes a support substrate and a flexible member coupled to the support substrate. The spatial light modulator also includes a mirror plate coupled to the flexible member and characterized by an activated position. The flexible member is adapted such that the mirror plate is capable of rotating in relation to an axis of the flexible member from the activated position to a second position at an average angular rotation rate greater than 4.0°/µs.

According to yet another embodiment of the present invention, a spatial light modulator for use in display applications is provided. The spatial light modulator includes a support substrate and a flexible member coupled to the support substrate. The spatial light modulator also includes a mirror plate coupled to the flexible member and characterized by an activated position. The flexible member is characterized by a torsional stiffness in a predetermined range from about 10 µN-µm to about 100 µN-µm.

Numerous benefits are achieved using the present invention over conventional techniques. For example, in an embodiment according to the present invention, a high stiffness torsion spring hinge is utilized to reduce sagging of the mirror plate, preventing contact between the mirror plate and the electrode structure. In some embodiments, the manufacturing process for a high stiffness torsion spring hinge is simplified in comparison with conventional techniques. Moreover, in a specific embodiment, the impact energy produced when the mirror plate makes contact with a landing structure is reduced. In addition, the electrode voltage utilized to switch the micro-mirror from one activated position to another activated position is decreased. Additionally, constraints on electrode voltage waveform characteristics, for example, rise times and fall times, are reduced by embodiments of the present invention. Depending upon the embodiment, one or more of these benefits may exist. These and other benefits have been described throughout the present specification and more particularly below.

Various additional objects, features and advantages of the present invention can be more fully appreciated with reference to the detailed description and accompanying drawings that follow.

BRIEF DESCRIPTION OF THE DRAWINGS

FIGS. 3A-3C are simplified cross-section views of a symmetric mechanical system (micro-mirror) supported by a torsion spring hinge at center point according to an embodiment of the present invention;

FIG. 5A is a simplified timing diagram illustrating a mirror switching operation according to an embodiment of the present invention;

FIG. 5B is a simplified graph showing mirror deflection angle as a function of time during the mirror switching operation;

FIGS. 5C-5F are simplified cross-sectional illustrations of a micro-mirror at various times during the mirror switching operations;

DETAILED DESCRIPTION OF SPECIFIC EMBODIMENTS

According to the present invention, techniques related to spatial light modulators are provided. More particularly, the invention relates to a method and structure for fabricating and/or operating a spatial light modulator with a high stiffness torsion spring hinge. Merely by way of example, the invention has been applied to initializing the micro-mirrors of a spatial light modulator using a resonant activation process. Additionally, the invention has been applied to a method of operating a spatial light modulator in a display application using a dynamic switching mode. The method and structure can be applied to spatial light modulators as well as other devices, for example, micro-electromechanical sensors, detectors, and displays.

Figure 1:
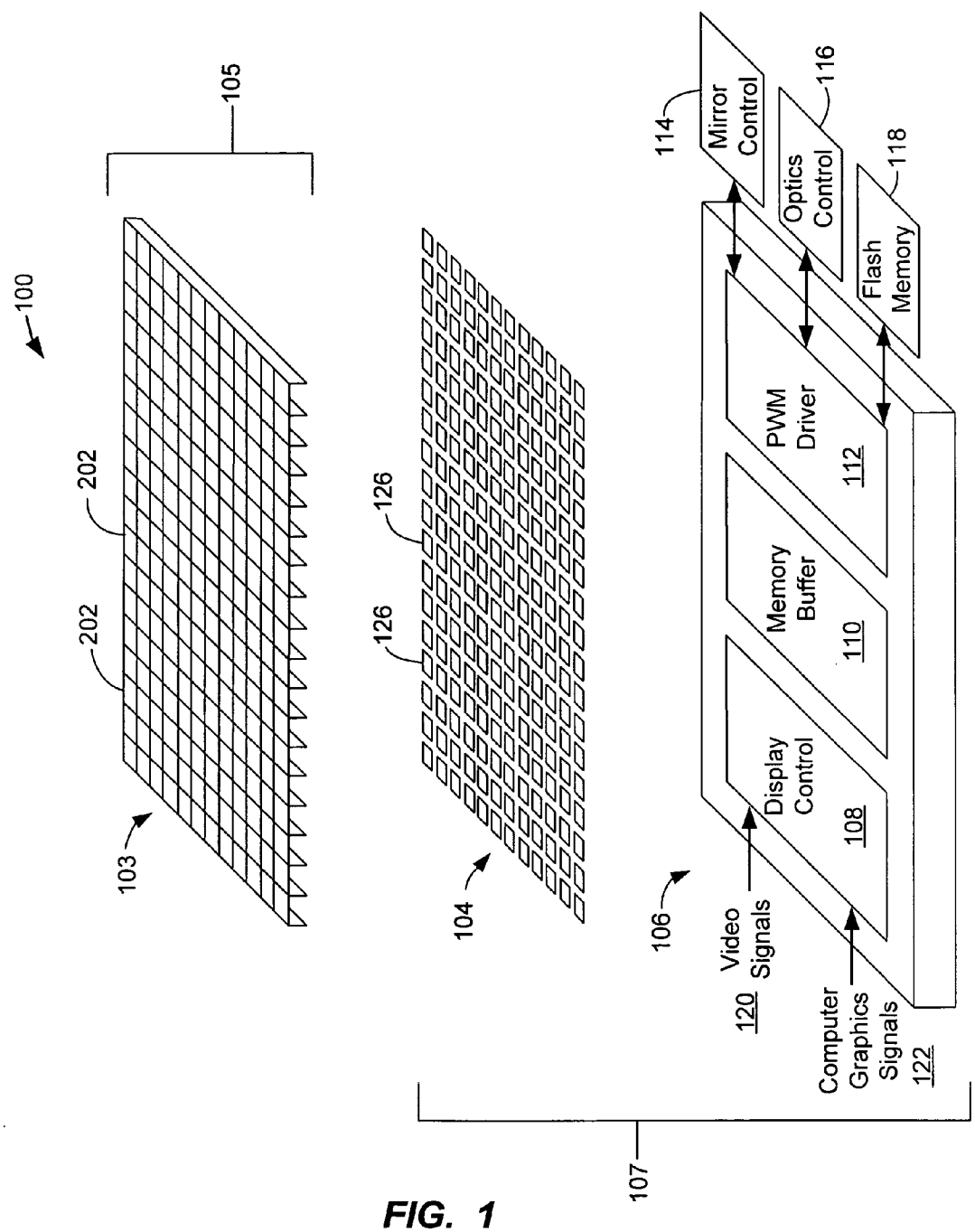
FIG. 1 is a simplified diagram illustrating the general architecture of an SLM according to an embodiment of the present invention.

FIG. 1 is a simplified diagram illustrating the general architecture of an SLM 100 according to an embodiment of the present invention. The illustrated embodiment has three layers. The first layer is a mirror array 103 that has a plurality of deflectable micro-mirrors 202. In a preferred embodiment, the micro-mirror array 103 is fabricated from a first substrate 105 that is a single material, such as single crystal silicon. The micro-mirrors 202 are characterized by a perimeter of less than 80 µm, and alternately by a perimeter of less than 50 µm. Additional details related to SLMs using such an architecture are described in U.S. patent application Ser. No. 10/756,936, entitled Reflective Spatial Light Modulator, filed Jan. 13, 2004, commonly assigned, and hereby incorporated by reference for all purposes.

The second layer is an electrode array 104 with a plurality of electrodes 126 for controlling the micro-mirrors 202. Each electrode 126 is associated with a micro-mirror 202 and controls the deflection of that micro-mirror 202. Addressing circuitry allows selection of a single electrode 126 for control of the particular micro-mirror 202 associated with that electrode 126.

The third layer is a layer of control circuitry 106. This control circuitry 106 has addressing circuitry, which allows the control circuitry 106 to control a voltage applied to selected electrodes 126. This allows the control circuitry 106 to control the deflections of the mirrors 202 in the mirror array 103 via the electrodes 126. Typically, the control circuitry 106 also includes a display control 108, line memory buffers 110, a pulse width modulation array 112, and inputs for video signals 120 and graphics signals 122. A microcontroller 114, optics control circuitry 116, and a flash memory 118 may be external components connected to the control circuitry 106, or may be included in the control circuitry 106 in some embodiments. In various embodiments, some of the above listed parts of the control circuitry 106 may be absent, may be on a separate substrate and connected to the control circuitry 106, or other additional components may be present as part of the control circuitry 106 or connected to the control circuitry 106.

In an embodiment according to the present invention, both the second layer 104 and the third layer 106 are fabricated using semiconductor fabrication technology on a single second substrate 107. That is, the second layer 104 is not necessarily separate and above the third layer 106. Rather, the term "layer" is an aid for conceptualizing different parts of the spatial light modulator 100. For example, in one embodiment, both the second layer 104 of electrodes is fabricated on top of the third layer of control circuitry 106, both fabricated on a single second substrate 107. That is, the electrodes 126, as well as the display control 108, line memory buffers 110, and the pulse width modulation array 112 are all fabricated on a single substrate in one embodiment. Integration of several functional components of the control circuitry 106 on the same substrate provides an advantage of improved data transfer rate over conventional spatial light modulators, which have the display control 108, line memory buffers 110, and the pulse width modulation array 112 fabricated on a separate substrate. Further, fabricating the second layer of the electrode array 104 and the third layer of the control circuitry 106 on a single substrate 107 provides the advantage of simple and cheap fabrication, and a compact final product. After the layers 103, 104, and 106 are fabricated, they are bonded together to form the SLM 100. Additional examples of methods for joining the substrates to form a bonded substrate structure are described in U.S. patent application Ser. No. 10/756,923, entitled Fabrication of a Reflective Spatial Light Modulator, filed Jan. 13, 2004, commonly assigned, and hereby incorporated by reference for all purposes.

As illustrated in FIG. 1, the substrate 105 includes a number of standoff regions extending from a lower portion of the substrate and arranged in an array as a waffle pack grid pattern. The standoff regions are adapted to align with bonding areas located between adjacent electrodes 126. Mirrors 202 are formed in the upper layers of substrate 105 by a release process in later stages of processing. In some designs, the standoff regions provide mechanical support for the mirror structure and are not moveable. Thus, light reflected from the upper surfaces of the standoff structures reduces the contrast of the optical system incorporating the spatial light modulator. In some designs, an absorbent material may be applied to the upper surfaces of the standoff regions to reduce reflections. However, these approaches reduce the fill factor of the array, potentially degrading system performance.

Figure 2:
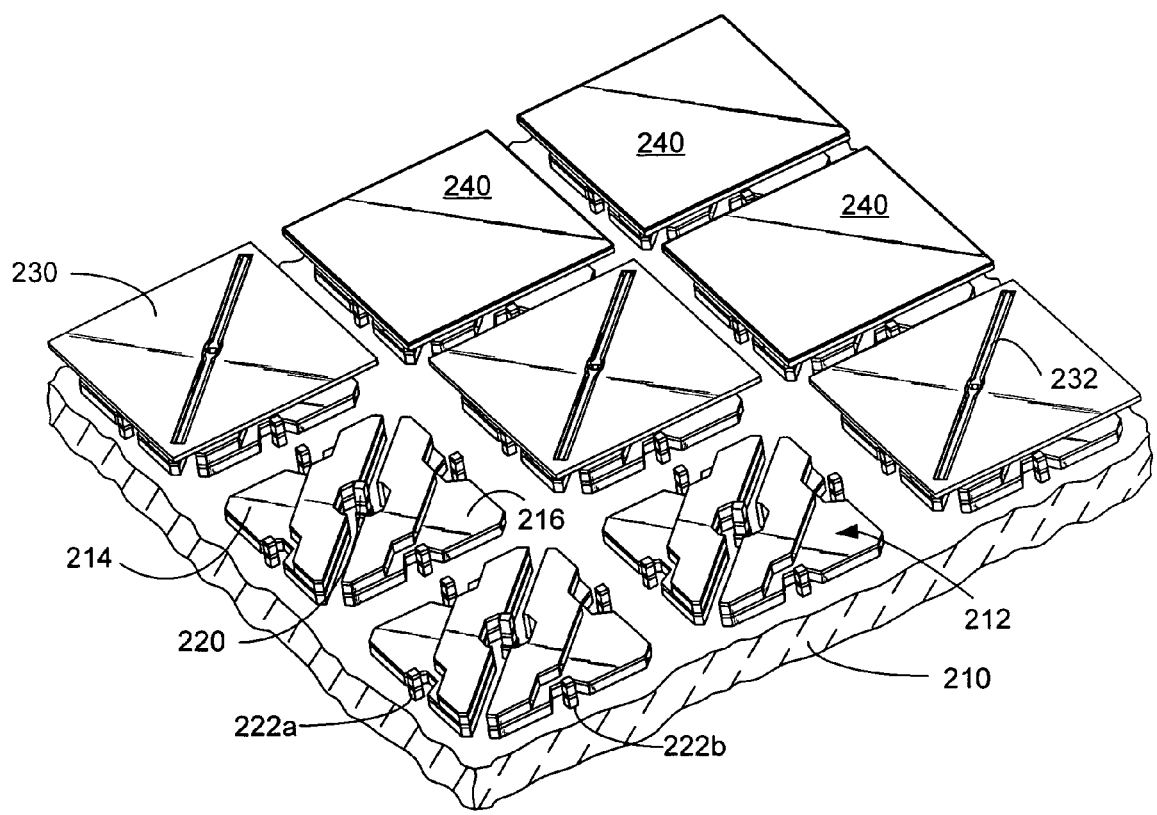
FIG. 2 is a simplified cutaway perspective view of an array of SLMs according to another embodiment of the present invention.

FIG. 2 is a simplified cutaway perspective view of an array of SLMs according to another embodiment of the present invention. As illustrated, this cutaway view is merely representative of the array of SLMs at various stages of processing. As described more fully below, independent control of the SLMs in an array is utilized in embodiments according to the present invention to form images in display applications and other apparatus.

As illustrated in FIG. 2, the array of SLMs is mounted on a support substrate 210. In some embodiments, the support substrate is a silicon substrate with CMOS control circuitry fabricated using semiconductor processing techniques. Multi-level electrodes 212 are coupled to the support substrate 210. As illustrated in FIG. 2, the multi-level electrodes comprise two complementary electrodes 214 (referred to as electrode E) and 216 (referred to as electrode $\overline{E}$) positioned on opposite sides of an integrated standoff structure 220. As described more fully below, in an embodiment, drive voltages of opposite polarity are provided to the complementary electrodes, providing electrostatic attraction forces acting on the micro-mirror plates 230. In other embodiments, the drive voltages are characterized by differing voltages, although not necessarily of opposite polarity. Moreover, in some alternative embodiments, the repulsion forces generated by the electrodes is negligible, with the restoring torque stored in the torsion spring hinge providing a torque sufficient to return the mirror to an unactivated position.

In operation, the individual reflective elements or pixels making up an array of micro-mirrors in an SLM are selectively deflected, thereby serving to spatially modulate light that is incident on and reflected by the micro-mirrors in the SLM. In order to deflect the micro-mirrors, a voltage is applied to the complementary electrodes 214 and 216 and the mirror plate to cause the mirror to rotate about the torsion spring hinge 232. As will be evident to one of skill in the art, the pixels are adapted to rotate in both clockwise and counter-clockwise directions depending on the particular electrode voltages. When the voltages are removed, the torque present in hinge 232 causes the mirror plate 230 to return to the unactivated position illustrated in FIG. 2.

FIG. 2 illustrates an embodiment of the present invention in which the complementary electrodes 214 and 216 are multi-level electrodes with raised central portions adjacent the center of the micro-mirror plates. Such multi-level electrodes reduce the distance between the top of the electrode surface and the micro-mirror plates, thereby decreasing the magnitude of the addressing voltages used to actuate the micro-mirror plates. However, embodiments of the present invention are not limited to multi-level electrodes. In alternative embodiments, other electrode geometries are utilized. One of ordinary skill in the art would recognize many variations, modifications, and alternatives.

As illustrated in FIG. 2, each micro-mirror plate 230 is coupled to the support substrate 210 by integrated standoff structure 220 and a torsion spring hinge 232. Referring to one of the micro-mirrors 240, upon actuation of the electrodes, the micro-mirror plate rotates in a plane orthogonal to the longitudinal axis of the torsion spring hinge. In some embodiments, the longitudinal axis of the torsion spring hinge is parallel to a diagonal of the micro-mirror plate. The motion of the micro-mirror is arrested by landing structures 222. In order to provide two actuated positions, complementary sets of landing structures 222a and 222b are provided on opposite sides of the integrated standoff structure. Thus, landing structures 222a arrest the motion of the micro-mirrors at a first actuated position and landing structures 222b arrest the motion of the micro-mirrors at a second actuated position. According to embodiments of the present invention, the micro-mirrors are tilted at predetermined angles in the actuated states, providing for controlled reflection of incident radiation. Embodiments of the present invention are not limited to the particular architecture described above. In alternative embodiments, a single landing pad located at the landing position of the mirror tip is used in place of the two landing posts. Moreover, two posts positioned at outer edges of the hinge may be used to replace the single standoff structure illustrated. One of ordinary skill in the art would recognize many variations, modifications, and alternatives.

The support substrate 210, the integrated standoff structures 220, and the micro-mirror plates 230 are joined using a substrate bonding process according to some embodiments of the present invention. In other embodiments, these structures are fabricated using a combination of deposition, patterning, etching, wafer bonding, and other semiconductor processing techniques. As illustrated in FIG. 2, reflective surfaces 240 are formed on the micro-mirror plates, providing an array of SLMs with hidden hinges. For purposes of clarity, the spacing between adjacent micro-mirrors is illustrated in FIG. 2 as a significant fraction of the mirror dimensions. As will be evident to one of skill in the art, reductions in the space between mirrors will result in an increased fill ratio and improved image quality in display applications. The spacing between adjacent micro-mirrors is generally defined using photolithographic processes, providing high fill ratio designs. Additional details related to the fabrication of integrated standoff structures and multi-level electrodes are described in U.S. patent application Ser. No. 11/250,320, entitled Spatial Light Modulator With Multi-Layer Landing Structures, filed Oct. 13, 2005, commonly assigned, and hereby incorporated by reference for all purposes.

During conventional operation of the SLM, the mirror is typically switched between a center or unactivated position and two complementary activated positions with equal and opposite deflection angles. In either of the activated positions, stiction forces present between the mirror plate of the micro-mirror and the landing structure, for example, the landing posts 222 illustrated in FIG. 2, may prevent the micro-mirror from returning to the center position. As will be evident to one of skill in the art, pixels of a display sticking in such an activated state is undesirable. Accordingly, embodiments of the present invention provide torsion spring hinges with increased stiffness to overcome stiction forces and free the micro-mirror from sticking in an activated state. As described below, high stiffness springs also provide for increased operational speed and manufacturability, among other benefits. A single crystalline silicon hinge is ideal for implementing this concept as its Young's modulus is more than twice that of aluminum and its yield stress, more than ten times that of aluminum. It in general also improves performance (by increasing the resonant frequency) and the manufacturability of the device.

Consider a symmetric mechanical system (micro-mirror) supported by a torsion spring hinge at center point as depicted in FIGS. 3A-3C. Under the condition of no dissipation, this is a conservative mechanical system, i.e. its kinetic energy can be converted into potential energy and vice versa. If the mirror (flat state being the equilibrium position) is initialized to the counter clockwise rotation with angle $\alpha$ (on-sate, FIG. 3A) and released, it will rotate clockwise to an angle of $-\alpha$ (off-state, FIG. 3B). In such an ideal system, the mirror can rotate from the on-state to the off-state without any additional energy. Furthermore, when the mirror reaches the off-state, its speed is zero and thus generates no impact at the contact.

Figure 3D:
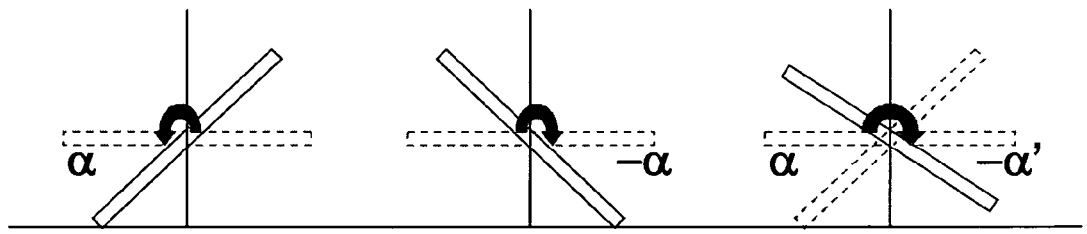
FIG. 3D shows data illustrating the rotation of a micro-mirror according to an embodiment of the present invention.
Figure 3D:
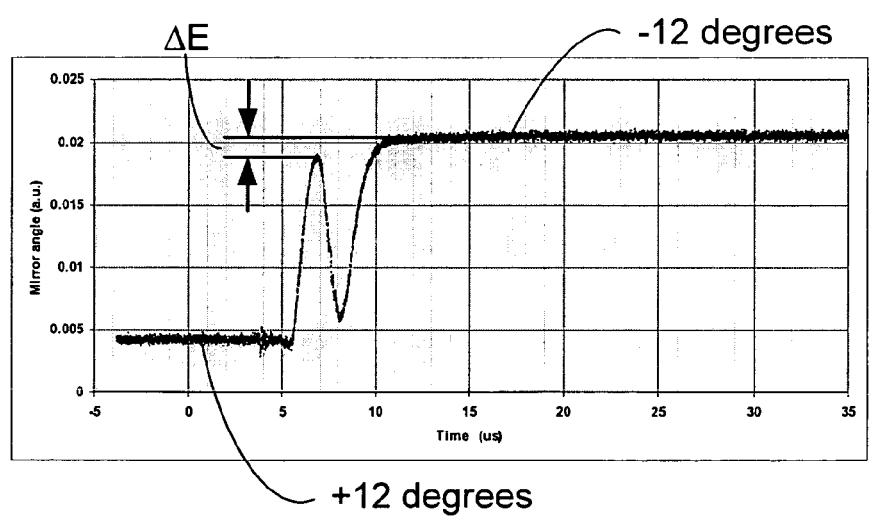

In a real system, dissipation is inevitable due to external interaction with air or internal heat (phonon) generation. In such a case, the mirror should rotate to $-\alpha'(|-\alpha'|<|-\alpha|)$, which should be very close the off-state if the dissipation is small. This is indeed observed with a real device. FIG. 3D shows data illustrating the rotation of a micro-mirror according to an embodiment of the present invention. As shown in FIG. 3D, only a small amount energy ($\Delta E$) is required to switch the mirror to the full off-state, ($-12$ degrees) if it is supplied when the mirror reaches $-\alpha'$. Properly matching the input energy to the amount dissipated can also minimize the landing impact and wear of the contact.

Figure 3E:
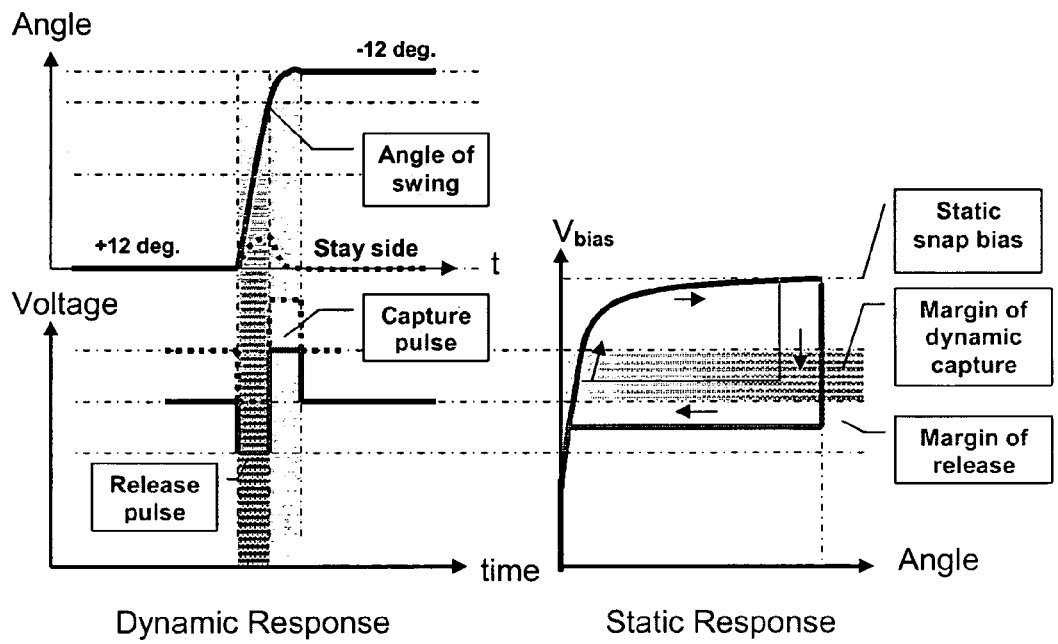
FIG. 3E illustrates dynamic and static response waveforms according to an embodiment of the present invention.

Implementation of the above concept can be realized with a dynamic drive waveform as illustrated in FIG. 3E (solid curve in lower left panel). Consider the mirror is initialized to the off-state, holding by a voltage at the middle level. This voltage then drops and held at the release-level for an interval $t_1$, allowing the mirror to swing to the opposite side. When it reaches the maximum rotation angle $-\alpha'$, the voltage level is promptly raised to the capture-level for an interval of $t_2$, to pull the mirror to the on-state before it resets to the hold-level. A similar wave form can be used to switch the mirror from the on-state to off-state.

Based on the nonlinear characteristics of the static response showing in FIG. 3E (lower right), if the mirror can swing to the opposite side close to the maximum angle, then a lower pull-down voltage (than the static pull-down voltage) will suffice to pull the mirror down to the "snap-in" position. This is another significant benefit of using the dynamic drive waveform.

The aforementioned dynamic switching concept can be applied to an array of identical micro-mirror device. The mechanical property of the individual hinge needs not be identical, though the margin of operation will depend on the uniformity of the array (see static response curve in FIG. 3E). Furthermore by addressing the electrodes of the mirror to create a differential bias voltage between the two sides of a mirror, one selectively switches the ones as desired, leaving the other to stay on the same side (see the dashed curve in FIG. 3E, left panels).

The dynamic switching scheme discussed above required the mirror be initialed to one of its full rotated state. With a high stiffness torsion hinge, it requires a higher DC pull-down voltage and hence a device having higher dielectric strength to avoid electrical breakdown.

Another embodiment of the present invention combines resonant excitation with the dynamic switching to initialize the mirror to one of the full rotated states at a lower actuation voltage compared to its DC pull down voltage. This embodiment will be discussed in additional detail with respect to FIGS. 4A and 4B.

Since the micro-mirror is an oscillator with a reasonable quality factor (Q), one can drive the device to resonance with an AC waveform (sinusoidal, for example) of a modest amplitude. As the angle of mirror swing increases to near "snap-in" position, say $\alpha'$, the switching pulse is applied synchronously to capture the mirror to the "snap-in" position. The mirror is initialized and the excitation waveform can be removed.

Figure 3F:
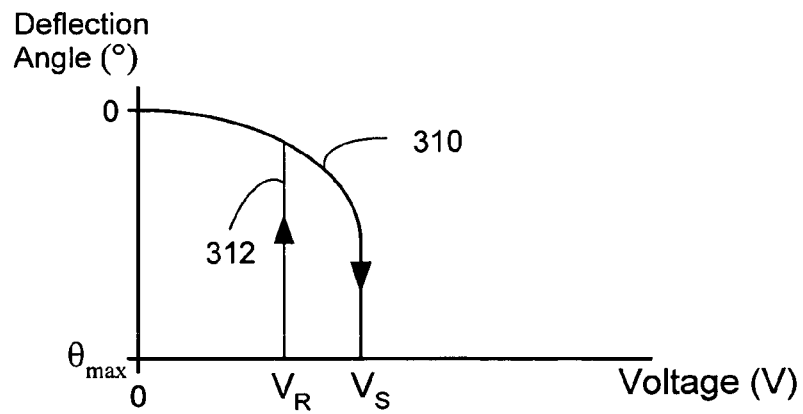
FIG. 3F is a simplified graph illustrating mirror deflection angle as a function of applied electrode voltage according to an embodiment of the present invention.

FIG. 3F is a simplified graph illustrating mirror deflection angle as a function of applied electrode voltage according to an embodiment of the present invention. As illustrated in FIG. 3F, at a zero applied voltage, the mirror deflection or tilt angle ($\theta$) is zero, a condition associated with the micro-mirror prior to power-up. As the voltage applied to the electrodes and mirror plate increases, the mirror begins to rotate under the influence of the applied voltage in a first direction as illustrated by curve 310. As shown in FIG. 3F, the mirror rotates in a direction characterized by a positive tilt angle, although a negative tilt angle is also utilized in other embodiments.

When the mirror plate deflects past the "snap-in" or "pull-in" voltage, $V_S$, (approximately 150 V in an embodiment), the restoring mechanical force or torque of the hinge can no longer balance the electrostatic force or torque and the mirror plate "snaps" down toward the electrode to achieve full deflection ($\theta_{max}$), limited only by motion stops provided by the SLM structure. This full deflection position is sometimes referred to as an activated position. Due to stiction forces and other effects, micro-mirrors provided according to embodiments of the present invention display hysteresis as illustrated in FIG. 3F. In other words, the voltage $V_R$ required to hold the mirror plates in the deflected position is less than that required for the actual deflection. Accordingly, in the activated positions, application of voltages less than $V_S$ and greater than $V_R$ result in a condition in which the electrostatic force due to the applied voltage and stiction are greater than the restoring force due to the torque stored in the spring. At the voltage $V_R$, the electrostatic attraction and stiction forces are balanced by the restoring force in the spring.

To release the mirror plate from its fully deflected position, the voltage is lowered to a value below the snap-in voltage $V_S$, to a releasing voltage $V_R$, as illustrated in FIG. 3F. Below the release voltage, the mirror rotates as illustrated by line 312, returning to the original undeflected position as the voltage is reduced to zero. The non-linearity in curve 310 results from the capacitance between the mirror plates and the support substrate being a function of deflection angle. As the mirror approaches the activated position, the increase in capacitance results in an increase in the electrostatic attraction force for a given voltage change.

Increases in hinge stiffness generally result in an increase in rotational velocity of the mirror plate, providing the benefit of increased operational speed. As will be evident to one of skill in the art, the angular frequency of a torsion spring hinge is proportional to the square root of the spring constant divided by the mass: $\omega=\sqrt{K/m}$. Thus, embodiments of the present invention utilize torsion spring hinges with increased spring constants compared to conventional hinges, increasing the angular velocity of the mirror plate coupled to the hinge. Additionally, an increase in spring constant results in an increased ability to overcome stiction forces present between the mirror plate and the landing structure. Reliability and lifetime are enhanced by embodiments of the present invention in which stiction forces are overcome by the torque stored in the torsion spring hinge with reduced or without reliance on lubricants. Furthermore, embodiments of the present invention provide spatial light modulator systems with increased manufacturability over conventional systems since the length of the spring can be decreased as the stiffness is increased.

However, although increasing the stiffness of the flexible member or torsion spring hinge generally results in an increase in both the electrode voltages shown as $V_S$ and $V_R$ in FIG. 3F. Moreover, as the rotational velocity of the mirror plate increases with the spring stiffness, an increase in the impact energy may be experienced when the mirror plate makes contact with motion stops, adversely impacting reliability. Embodiments of the present invention provide solutions to these issues through the use of resonant activation and dynamic switching as described more fully below.

Referring to FIG. 3F, as the voltage approaches $V_S$ along curve 310, the slope of the mirror deflection angle versus voltage increases dramatically. The rapid change in angle as the mirror "snaps" to the full deflection angle results in the mirror plate striking the motion stops with an undesirable impact energy. Thus, as described more fully below, to overcome this undesired result, embodiments of the present invention provide a resonant activation process that reduces the impact energy, thereby providing increased device lifetime and reliability among other benefits.

Figure 4A:
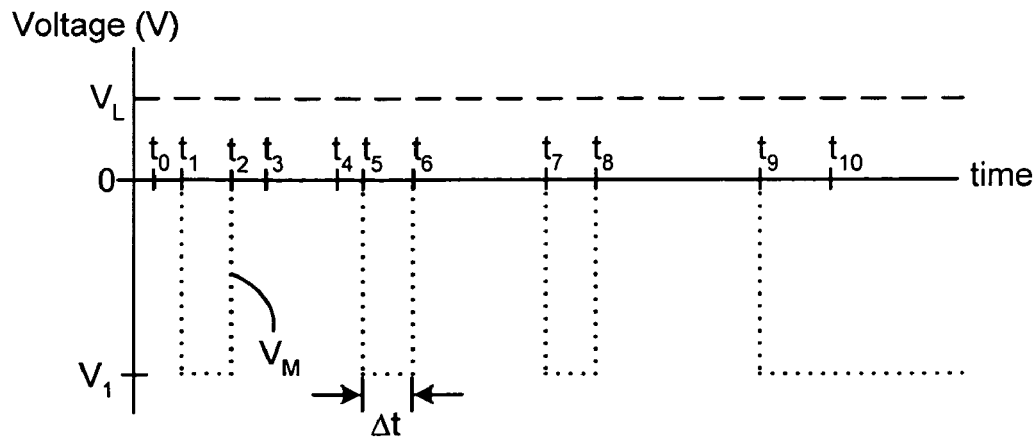
FIG. 4A is a simplified timing diagram illustrating a resonant activation procedure according to an embodiment of the present invention.

FIG. 4A is a simplified timing diagram illustrating a resonant activation procedure according to an embodiment of the present invention. The voltage applied to the first complementary electrode ($V_L$) is shown as a constant value as a function of time. The voltage applied to the second complementary electrode ($V_R$) is zero in FIG. 4A and thus not illustrated.

The voltage applied to the mirror (bias voltage) is represented by the dotted line $V_M$ and varies as a function of time. At an initial time $t_0$, the mirror voltage is equal to zero and the mirror is in an unactivated position. FIG. 4C is a simplified cross-sectional illustration of a micro-mirror in the unactivated position at time $t_0$. As illustrated in FIG. 4C, the mirror deflection angle is equal to zero. In FIG. 4C, the voltage applied to the various components of the SLM are represented by the voltage symbols $V_L$, $V_R$, and $V_M$. Merely by way of example, in a video display application, time $t_0$ would represent a time when the video display system is turned off prior to power-up.

At a time $t_1$, the voltage applied to the mirror is changed to $V_1$. As described more fully below, the voltage $V_1$ is less than the static snap-in voltage $V_S$ illustrated in FIG. 3F. As an example, the mirror voltage $V_1$ is about −100 V in an embodiment. In other embodiments, the mirror voltage ranges from about −35 V to about −170 V. The voltage will depend on the particular applications. The mirror voltage $V_M$ is maintained at $V_1$ for a predetermined time $\Delta t$ between $t_1$ and $t_2$. The predetermined time $\Delta t$ is selected based on a number of parameters including, for example, the torsion spring stiffness and the mirror dimensions. Although the time $\Delta t$ illustrated in FIG. 4A is equal for each of the three voltage pulses between $t_1$ and $t_2$, $t_5$ and $t_6$, and $t_7$ and $t_8$, respectively, this is not required by the present invention.

The length of each pulse may be varied in other embodiments as appropriate to the particular implementation. Moreover, the amplitude of the three voltage pulses shown in FIG. 4A may be varied from pulse to pulse or during each pulse depending on the application. Furthermore, as will be evident to one of skill in the art, the number of pulses utilized may be varied to increase or decrease the number of pulses as a function of, for example, the voltage amplitude and the system Q factor.

Figure 4B:
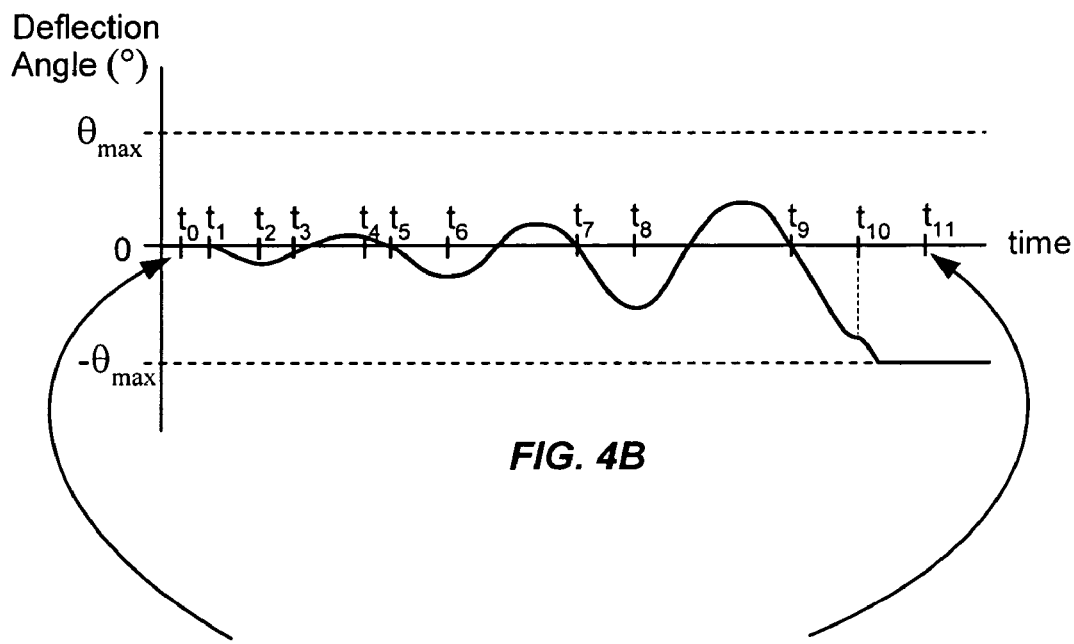
FIG. 4B is a simplified graph showing mirror deflection angle as a function of time according to an embodiment of the present invention.
Figure 4C:
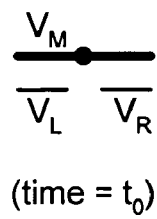
FIGS. 4C and 4D are simplified cross-sectional illustrations of a micro-mirror in unactivated and activated positions, respectively, according to an embodiment of the present invention.

FIG. 4B is a simplified graph showing mirror deflection angle as a function of time according to an embodiment of the present invention. When the mirror voltage is set to $V_1$ at time $t_1$, the mirror begins to deflect at a negative angle as illustrated in FIG. 4B. The deflection angle of the mirror increases in a first (negative) rotation direction and reaches a local maximum at time $t_2$, coincident with the end of the first voltage pulse. At time $t_2$, the mirror voltage is reduced to zero and the mirror begins to counter-rotate in response to the torque on the torsion spring hinge. At time $t_3$, the mirror is counter-rotating towards a local maximum between time $t_3$ and $t_4$. At time $t_4$ the mirror is rotating in the first direction back toward the center position illustrated in FIG. 4C. Thus, a series of mirror oscillations is initiated by applying the voltage pulse during time $t_1$ and $t_2$ to the mirror. Utilizing the high stiffness hinge described herein, the initial oscillation amplitude is small, increasing as voltage pulses are repeatedly applied to the mirror plate.

At time $t_5$, the mirror voltage is set to $V_1$ and the deflection angle of the mirror increases once again in the first rotation direction. As will be evident to one of skill in the art, the timing of the second pulse beginning at time $t_5$ is selected to resonantly enhance the rotation and counter-rotation of the mirror. As an example, for a representative high stiffness hinge, the resonant frequency is about 1.5 MHz. Of course, the particular resonant frequency will be a function of the materials and dimensions of the SLM structure, such as the hinge and mirror plate. Accordingly, the amplitude of the deflection angle oscillations increases as a function of time as illustrated in FIG. 4B. At time $t_6$, the mirror once again reaches a local maximum in the first rotation direction. When the mirror voltage is once again reduced to zero at time $t_6$, the mirror begins counter-rotating, reaching a local maximum between time $t_6$ and $t_7$ at a greater angle than achieved for the local maximum between time $t_3$ and $t_4$.

Figure 4D:
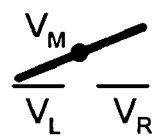

The third mirror voltage pulse is applied at time $t_7$ and extends until time $t_8$. At time $t_9$, which corresponds to the mirror being in the position illustrated in FIG. 4C, but rotating in the first direction, the mirror voltage is once again set at $V_1$ and the mirror continues rotating in the first rotation direction under the influence of the applied voltage. At time $t_{10}$, the mirror reaches an angle defined as the dynamic angle. The dynamic angle is the angle at which the mirror reaches what would be a local maximum. As illustrated in FIG. 4B, after time $t_{10}$, the mirror snaps in to the snap-in angle ($-\theta_{max}$), which is a maximum deflection angle. It should be noted that through the use of the resonant activation mode described herein, the voltage $V_1$ utilized to achieve the fully activated mirror position illustrated in FIG. 4D at time $t_{11}$ is less than a static snap-in voltage.

Referring to FIGS. 4A and 4B, at time $t_9$-$t_{10}$, the distance between the mirror plate and the electrodes is less than the distance at time $t_0$. Thus, the voltage needed to rotate the mirror to the snap-in angle ($-\theta_{max}$) is reduced from the static snap-in voltage, in which the mirror is rotated from the position illustrated in FIG. 4C to the position illustrated in FIG. 4D by the application of a single voltage higher than voltage $V_1$.

In applications using SLMs, digital operation is achieved by reflecting light off pixels positioned in one of two activated positions, $\theta_{max}$ and $-\theta_{max}$, respectively. During an initial start-up phase, all pixels in a given SLM are resonantly activated using the resonant turn-on sequence illustrated in FIGS. 4A and 4B. As a result, the pixels are all positioned to either reflect light toward a viewing screen or an optical dump, depending on the particular implementation. In an alternative embodiment, the position of the initial start-up phase varies, with mirrors positioned as either $\theta_{max}$ or $-\theta_{max}$ in an ordered or randomized manner. The initial position is somewhat arbitrary, since, as the display of video signals begins, the positions of the pixels are modulated in response to the signal using a pulsed waveform as described below. One of ordinary skill in the art would recognize many variations, modifications, and alternatives.

According to embodiments of the present invention, the micro-mirrors in an array are electromechanically bistable devices. Given a specific voltage between the releasing voltage and the snapping voltage, there are two possible deflection angles at which the mirror plate may be, depending on the history of mirror plate deflection. Therefore, the mirror plate deflection acts as a latch. We believe these bistability and latching properties exist since the mechanical force required for deflection of the mirror plate is roughly linear with respect to deflection angle, whereas the opposing electrostatic force is inversely proportional to the distance between the mirror plate and the electrode.

In some conventional SLM systems, the SLM operation of a pixel involves rotating the micro-mirror from a center position to a first activated position, returning the mirror to the center (unactivated) position, and then rotating the micro-mirror to a second activated position. As an example, the two activated positions may be tilted at equal and opposite rotation angles. Embodiments of the present invention utilize the potential energy stored in the hinge when at a first activated position to reduce the snap-in voltages used to position the mirror in a second activated position. This method of operating an SLM is referred to as dynamic switching and reduces the electrode voltages utilized during mirror operation.

FIG. 5A is a simplified timing diagram illustrating a mirror switching operation according to an embodiment of the present invention. The voltages applied to the complementary electrodes ($V_L$ and $V_R$) are switched at a time to as illustrated in FIG. 5A. The mirror voltage is changed from a first voltage $V_1$ to a second voltage $V_2$ at time $t_1$. In an embodiment, the voltage $V_1$ is −120 V and the voltage $V_2$ is −90 V. In other embodiments, the values of the voltages $V_1$ and $V_2$ range from about −35 V to about −170 V and from about −30 V to about −160 V, respectively. Of course, the values utilized will depend on the particular applications. As illustrated in FIG. 5C, the mirror is positioned at a first maximum rotation angle at time $t_0$.

FIG. 5B is a simplified graph showing mirror deflection angle as a function of time during the mirror switching operation. In response to the change in the mirror voltage at time $t_1$, the mirror is released and begins rotating in the clockwise direction due to the torque stored in the torsion spring hinge. Because of the high stiffness hinge provided by embodiments of the present invention, stiction forces present in the vicinity of the left electrode are less than the torque stored in the torsion spring hinge. Moreover, the high stiffness hinge results in a rapid rotation of the mirror in the clockwise direction. In some embodiments of the present invention, the transition time from the position illustrated in FIG. 5C to the position illustrated in FIG. 5F is about 0.3 µs to about 2.0 µs.

As will be evident to one of skill in the art, the high stiffness hinge enables the micro-mirror to rotate away from the activated position shown in FIG. 5C at a high angular rate under the influence of the spring alone, independent of electrode voltages applied to the complementary electrodes or the mirror plate. In designs utilizing conventional weak hinges, the rotation rate of the mirror plate is governed by the various applied voltages, not the response inherent in the high stiffness hinges described herein. In a specific embodiment, the maximum rotation rate of the mirror plate is in a predetermined range, for example from about 20 degrees per microsecond to about 115 degrees per microsecond. Preferably the rotation rate ranges from about 45 degrees per microsecond to about 70 degrees per microsecond. One of ordinary skill in the art would recognize many variations, modifications, and alternatives.

At time $t_2$, the mirror passes through an undeflected or center position as it continues to rotate in the clockwise direction. The mirror reaches what would be a local maximum at time $t_3$. The pulse width δt is selected so that as the mirror rotation angle approaches the dynamic snap-in angle ($\theta_{dynamic}$) at time $t_3$, the mirror voltage is changed back to the voltage $V_1$. Among other factors, the close proximity of the mirror plate to the right electrode enables the mirror to be snapped-in at a voltage less than the static snap-in voltage, positioning the mirror at a second maximum rotation angle ($\theta_{max}$) at time $t_4$. Thus, in an embodiment, the torque stored in the spring is used to rotate the mirror, independent of applied voltages, to a rotation angle nearly equal to the maximum rotation angle. As a result of the use of the dynamic switching operation, the voltage needed to actuate the mirror are reduced. A similar dynamic switching operation is utilized to return the mirror to the first maximum rotation angle.

According to embodiments of the present invention, the pulse width δt, the characteristics of the flexible member or hinge coupled to the micro-mirror, particularly the stiffness of the hinge, and the maximum rotation angle of the micro-mirror are related to facilitate a dynamic switching operation. After initialization in one of the two activated positions ($\theta_{max}$ and $-\theta_{max}$), the duration $\delta t$ of the mirror voltage pulse is selected to end the voltage pulse coincident with the mirror's rotation angle reaching the dynamic snap-in angle. In a specific embodiment, the high stiffness torsion spring hinge reduces the time $\delta t$ to a value less than that characteristic of conventional hinges used for micro-mirrors in display applications. Merely by way of example, the time $\delta t$ is approximately equal to 1.0 µs in an embodiment. In other embodiments, the value of $\delta t$ ranges from about 0.3 µs to about 2.0 µs. Of course, the particular value will depend on the various applications.

Referring once-again to FIG. 5B, damping in the torsion spring hinge results in the mirror rotating to the dynamic rotation angle, which is less than the maximum angle. In other words, in the absence of damping or losses in the hinge, the mirror, when released at one maximum rotation angle would rotate to the complementary maximum rotation angle. The angular velocity of the mirror rotation starts at zero at time $t_1$, reaches a peak at time $t_2$, and returns to zero at time $t_3$. Because the angular velocity at time $t_3$ is zero, the impact energy when the mirror snaps-in shortly after time $t_3$ is reduced compared to conventional designs.

The duration of the mirror voltage pulse $\delta t$ influences the impact energy with which the mirror strikes the electrodes, landing structures, or other motion stops. The impact energy is the kinetic energy of the mirror at contact with motion stops after rotation from a first activated position to a second activated position. Preferably, the energy stored in the high stiffness hinge when the mirror is in an activated position provides the majority of energy needed to rotate the mirror from the first activated position to the second activated position.

The mirror voltage pulse is timed to return to voltage $V_1$ when the mirror is at the dynamic snap-in angle, minimizing the distance between the mirror plate and electrode, and thereby reducing the applied voltage used to position the mirror at the second activated position. Moreover, with the distance between the mirror plate and the electrode reduced, the distance over which the mirror is accelerated as it rotates from the dynamic snap-in angle to the maximum deflection angle is reduced, thereby limiting the angular velocity of the mirror at impact. In contrast with conventional designs using static snap-in voltages, embodiments of the present invention provide reductions in the impact energy that contribute to enhanced lifetime and reliability. Thus, embodiments of the present invention provide not only reduced operating voltages and higher speed operation, but reduced mechanical impact.

The impact energy with which a micro-mirror contacts a landing structure is influenced by the magnitude of the electrode voltage utilized to achieve a snap-in condition. Most of the electrostatic energy imparted to the moving micro-mirror is absorbed on landing, causing stiction and wear. According to embodiments of the present invention, by reducing the electrostatic energy required to snap-in the micro-mirror, improved lifetime and wear resistance is achieved.

The electrostatic energy ($E_e$) required to snap-in a micro-mirror is calculated using:

$$E_e = \frac{1}{2}C(\alpha)V^2,$$

where C is the capacitance and V is the driving voltage.

Embodiments of the present invention using dynamic switching provide for softer landings (reduced impact energy) by utilizing a lower driving voltage as compared to alternate systems. The lower driving voltage is $V'=V-\delta V$. Therefore the change in electrostatic energy is:

$$\delta E_e = C(\alpha) V \cdot \delta V$$

and $$\frac{\delta E}{E} = \frac{2 \cdot \delta V}{V}.$$

Conservatively speaking, embodiments of the present invention provide for at least a 10% reduction in the driving voltage when using dynamic switching. This results in a 20% reduction in impact energy. For micro-mirrors with excellent structural uniformity, a minimum 20% reduction in driving voltage is possible, resulting in at least a 40% reduction in impact energy.

Figure 6:
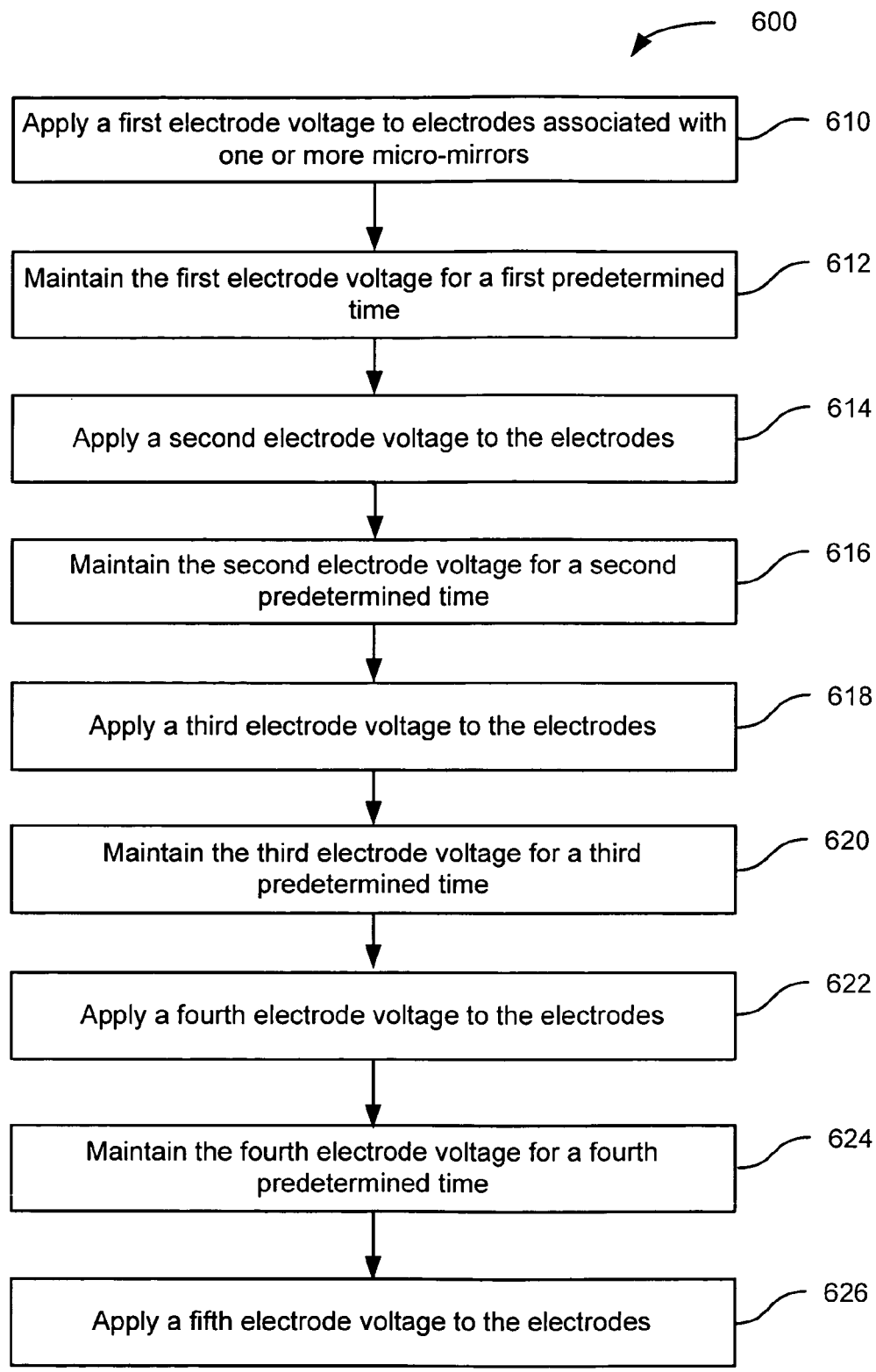
FIG. 6 is a simplified flowchart illustrating a method of activating a micro-mirror according to an embodiment of the present invention.

FIG. 6 is a simplified flowchart illustrating a method of activating a micro-mirror according to an embodiment of the present invention. A method 600 of resonantly activating one or more micro-mirrors in a spatial light modulator array is provided as follows. A first electrode voltage is applied (610) to electrodes associated with the one or more micro-mirrors. The application of the first electrode voltage results in the micro-mirror being positioned at a first negative deflection angle during a first time. Referring to FIG. 4B, at time $t_2$, the mirror plate reaches a local maximum deflection angle. Although the angle illustrated at time $t_2$ is a negative deflection angle, one of ordinary skill in the art will appreciate that the initial rotation angle will depend on the particular applications. In some embodiments, the initial rotation angle will be a positive deflection angle.

The first electrode voltage applied to the electrodes is maintained (612) at the first electrode voltage for a first predetermined time. In the embodiment illustrated in FIG. 4A, the first predetermined time is $\Delta t$. Of course, the predetermined first time will depend on the characteristics of the torsion spring hinge, the magnitude of the first electrode voltage, and other factors. As illustrated in FIGS. 4A and 4B, the first predetermined time is selected so that the end of the first voltage pulse is aligned with the mirror plate reaching the local maximum deflection angle.

A second electrode voltage is applied to the one or more electrodes (614). The application of the second electrode voltage results in the micro-mirror rotating to a first positive deflection angle during a portion of the application of the second electrode voltage. In a particular embodiment, the second electrode voltage is ground. Responding to the torque stored in the torsion spring hinge, the micro-mirror rotates past zero and toward a positive deflection angle. As illustrated in FIGS. 4A and 4B, the micro-mirror is positioned at a local maximum deflection angle at time between times $t_3$ and $t_4$. The second electrode voltage is maintained for a second predetermined time (616). As will be evident to one of skill in the art, the second predetermined time is selected based on similar factors as discussed in relation to the first predetermined time.

A third electrode voltage is applied to the one or more electrodes (618). The micro-mirror is positioned at a second positive deflection angle as a result of the application of the third electric voltage. The second positive deflection angle is greater than the first positive deflection angle during a portion of the application of the third electrode voltage. Referring once again to FIGS. 4A and 4B, in an embodiment, the third electrode voltage is applied during times $t_5$ and $t_6$ and is equal in amplitude to the first electric voltage. The third electrode voltage is maintained for a third predetermined time (620). The second positive deflection angle is a local maximum at time $t_6$, which corresponds to the end of the third electric voltage pulse.

A fourth electrode voltage is applied to the one or more electrodes (622). The micro-mirror rotates to a second negative deflection angle greater than the first negative deflection angle during a portion of the application of the fourth electrode voltage. The fourth electrode voltage is maintained for a fourth predetermined time (624). A fifth electrode voltage is applied to the one or more electrodes (626). The micro-mirror is positioned at a third positive deflection angle greater than the second positive deflection angle during a portion of the application of the fifth electrode voltage. Referring to FIGS. 4A and 4B, the fifth electrode voltage may be the voltage applied after time $t_9$. Of course, the total number of voltage pulses will depend on a variety of factors, including the torsion spring stiffness, the magnitude of the applied voltages, the system mass, and the like. According to embodiments of the present invention, resonant activation as illustrated in FIG. 6 is utilized to position the micro-mirror in a first activated position illustrated time $t_{11}$.

The above sequence of steps provides a method for resonantly activating a micro-mirror according to an embodiment of the present invention. As shown, the method uses a combination of steps including a way of applying and maintaining a series of electrode voltages to resonantly rotate the micro-mirror from an unactivated position to an activated position according to an embodiment of the present invention. Other alternatives can also be provided where steps are added, one or more steps are removed, or one or more steps are provided in a different sequence without departing from the scope of the claims herein.

In the embodiment of the present invention illustrated in FIGS. 4A and 4B, the amplitude, shape, and duration of the first and third voltage pulses are equal. However, this is not required by the present invention. In other embodiments, these characteristics are varied as appropriate to the particular application. For example, the shape of the voltage pulse may not be square, but may be sinusoidal, triangular, and the like. One of ordinary skill in the art would recognize many variations, modifications, and alternatives. Moreover, the length and temporal positioning of the pulses may be varied as appropriate to the particular application.

Figure 7:
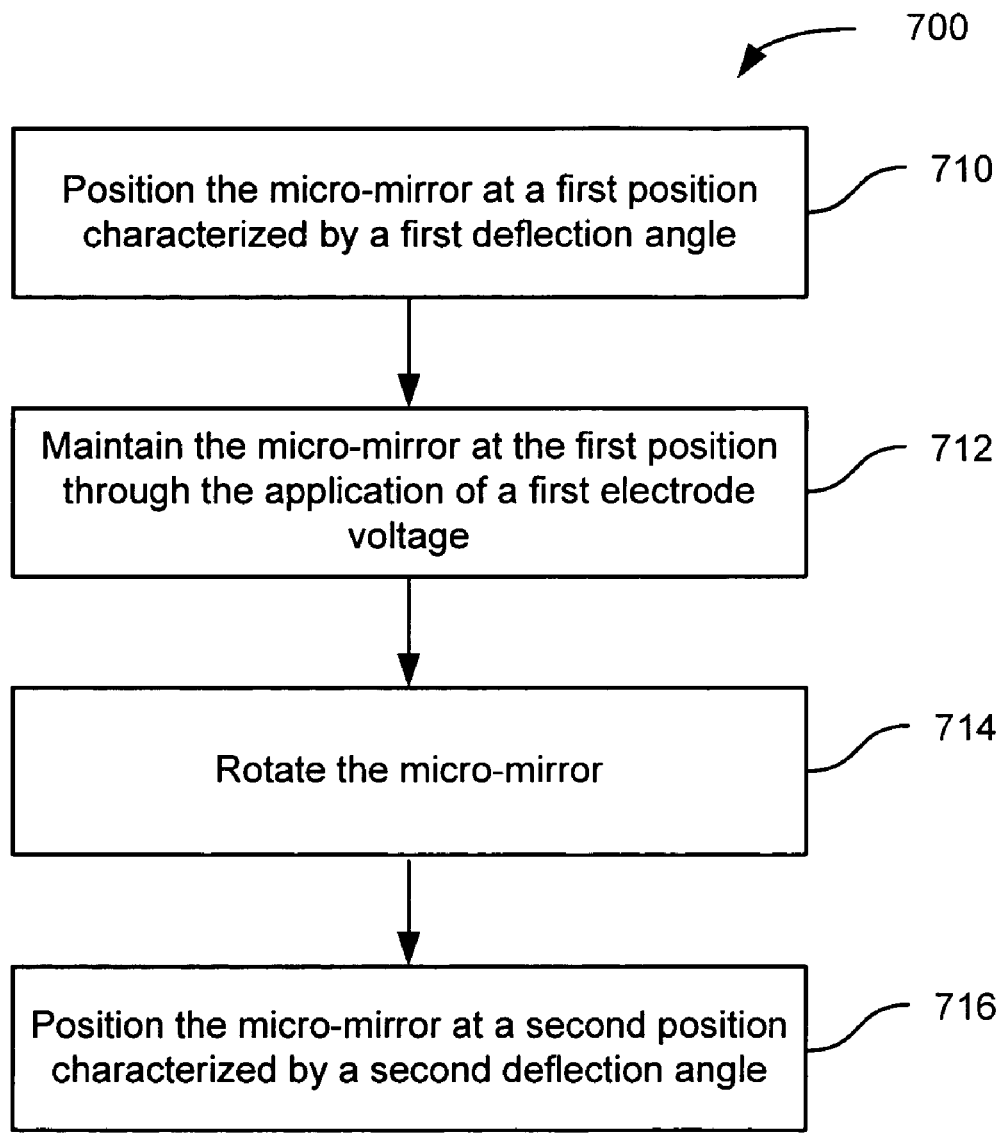
FIG. 7 is a simplified flowchart illustrating a method of operating a micro-mirror according to an embodiment of the present invention.

FIG. 7 is a simplified flowchart illustrating a method of operating a micro-mirror according to an embodiment of the present invention. The method 700 provides for dynamic switching of a micro-mirror from a first activated position to a second activated position. As an example, the micro-mirror may be positioned in the first activated position using a method as described in relation to FIG. 6.

The micro-mirror is positioned at a first position characterized by a first deflection angle (710). The micro-mirror is maintained at the first position through the application of a first electrode voltage (712). In the embodiment illustrated in FIGS. 5A and 5B, the first deflection angle is a snap in angle with a negative magnitude. The micro-mirror is rotated (714). In an embodiment, the rotation of the mirror is accomplished by releasing the first electrode voltage, resulting in rotation of the mirror under the influence of the stored torque in the torsion spring hinge. The micro-mirror is positioned at a second position characterized by a second deflection angle (716). The micro-mirror is positioned at the second position through the application of a second electrode voltage less than a static snap-in voltage.

The above sequence of steps provides a method for dynamically switching a micro-mirror according to an embodiment of the present invention. As shown, the method uses a combination of steps including a way of positioning a micro-mirror at a first activated position, rotating the micro-mirror, and positioning the micro-mirror at a second activated position according to an embodiment of the present invention. Other alternatives can also be provided where steps are added, one or more steps are removed, or one or more steps are provided in a different sequence without departing from the scope of the claims herein.

Table 1 shows the angular rotation angle in degrees for a mirror switching operation as a function of the switching speed in microseconds and the average angular rotation rate in degrees per microsecond for MEMS according to an embodiment of the present invention. Referring to the first row of data, for rotation of a micro-mirror from $-12°$ to $+12°$ (a total of 24°) in a time period of 6 µs, the average angular rotation rate is 4°/µs. As the switching speed increases for a given angle of rotation, the average angular rotation rate increases as well.

TABLE 1

| Angular Rotation (°) | Switching Speed (µs) | Average Angular Rotation Rate (°/µs) |
| --- | --- | --- |
| +/−12 | 6 | 4 |
| +/−12 | 4 | 6 |
| +/−12 | 3 | 8 |
| +/−12 | 2 | 12 |
| +/−12 | 1 | 24 |
| +/−12 | 0.5 | 48 |
| +/−12 | 0.3 | 80 |
| +/−14 | 6 | 4.67 |
| +/−14 | 4 | 7 |
| +/−14 | 3 | 9.33 |
| +/−14 | 2 | 14 |
| +/−14 | 1 | 28 |
| +/−14 | 0.5 | 56 |
| +/−14 | 0.3 | 93.33 |
| +/−15 | 6 | 5 |
| +/−15 | 4 | 7.5 |
| +/−15 | 3 | 10 |
| +/−15 | 2 | 15 |
| +/−15 | 1 | 30 |
| +/−15 | 0.5 | 60 |
| +/−15 | 0.3 | 100 |

Embodiments of the present invention utilize high stiffness hinges that provide for rapid rotation of the mirror as illustrated in Table 1. Thus, as described above, in some embodiments of the present invention, the transition time from one activated position to another activated position is from about 0.3 µs to about 6.0 µs. Moreover, the high stiffness hinges provided by embodiments of the present invention enable the micro-mirror to achieve a maximum rotation rate in a predetermined range, for example from about 4°/µs to about 100°/µs.

For a torsion spring hinge, the restoring torque $T_S$ is equal to the torsional spring constant $k_{tor}$ times the angle of rotation θ: $T_S = k_{tor} \theta$. The restoring force at a selected portion of the mirror plate is equal to the restoring torque $T_S$ present in the torsion spring hinge divided by the distance d from the torsion spring hinge to the selected position. Thus, as the distance from the torsion spring hinge to the contact point increases, the restoring force present at the contact point available to overcome stiction forces decreases. As illustrated in FIG. 2, the distance d is measured from the torsion spring hinge 232 to the landing posts 222 along a line perpendicular to the diagonal of the mirror plate. For a given distance d between the torsion spring hinge and the contact position, an increase in restoring torque will provide increased resistance to stiction problems.

For torsion spring hinges provided by embodiments of the present invention, the torsion spring constant, $k_{tor}$, is approximated as $$k_{tor} \propto \frac{Thickness_{hinge} \cdot Width_{hinge}^3}{Length_{hinge}}. \quad (1)$$

Thus, embodiments of the present invention utilize torsion spring hinges with increased thickness and/or width or decreased length to increase the torsional spring constant and the restoring force present at a given contact location.

Another design consideration in selecting the hinge dimensions is the vertical sag or bending observed in the torsion spring hinge. In embodiments of the present invention, it is preferable to minimize the amount of sagging observed in the hinge since vertical sag results in unpredictability in the deflection angle. Vertical sag in the flexible member also results in clearance problems between the mirror plate and the electrodes. In embodiments of the present invention utilizing a multilevel electrode as illustrated in FIG. 2, an increase in mirror plate sagging will result in designs with smaller top electrodes, reducing the electrostatic attraction forces between the electrodes and the mirror plate. In some embodiment, repulsion forces are not present.

The bending stiffness of a hinge is related to the vertical hinge spring factor $k_{ver}$, which is approximated by:

$$k_{ver} \propto \frac{Thickness_{hinge}^3 \cdot Width_{hinge}}{Length_{hinge}^3} \quad (2)$$

Relating the vertical bending stiffness to the torsional spring constant provides a measure of the amount of sag present in a hinge of a predetermined geometry. In particular, minimizing the ratio between the torsional spring constant and the vertical bending stiffness will minimize the vertical sag by increasing the vertical stiffness in relation to the torsional spring constant:

$$\frac{k_{tor}}{k_{ver}} \propto \left( \frac{Width_{hinge} \cdot Length_{hinge}}{Thickness_{hinge}} \right)^2 \quad (3)$$

Thus, embodiments of the present invention provide a torsion spring hinge that is preferably characterized by a narrow width, short length, and large thickness.

To increase system reliability, it is preferable to maintain stress present in the hinge at a level below the yield strength of the hinge material. Generally, it is expected that a shorter hinge will result in greater stress than a longer hinge since the torsion per unit length is larger for a shorter spring. However, the present inventors have found that when two hinges of different length and the same torsional stiffness are compared, the shorter hinge is not necessarily characterized by a higher maximum stress. We believe that the reason for this result, without limiting the present invention, is that a longer hinge will experience greater sag, increasing stress in the longer hinge due to bending of the hinge.

Merely by way of example, a finite element analysis of two hinge geometries was performed. In the analysis, the first hinge had a length of 7.1 µm and a width of 0.3 µm and the second hinge had a length of 4.6 µm and a width of 0.25 µm. Both hinges had a thickness of 0.425 µm and a stiffness of about 40 µN-µm. Based on the results of the finite element analysis, the maximum Von Mises stress in the hinges in both cases was the same, namely 1.50 GPa. The longer hinge is characterized by about twice the amount of sag as the shorter hinge since the longer hinge is weaker in the vertical direction (i.e., the width times the length is larger). Although the torsion angle per unit length for the longer hinge is less than that for the shorter hinge, we believe the additional sag in the longer hinge results in both hinges having the same maximum stress.

This conclusion is further supported by our observation that hinges with different lengths but similar torsion strengths have a different snap-in voltage. The snap-in voltage is defined as the voltage at which the mirror plate switches to an activated position. In particular, the inventors have found the snap-in voltage for the longer hinge is less than the snap-in voltage for the shorter hinge. We believe that the lower snap-in voltage observed for the longer hinge is due to an increased amount of sag in the longer hinge, which results in a smaller effective gap between the mirror plate and the electrodes. Along with the reduced snap-in voltage, the longer hinge is characterized by a reduced snap-in mirror angle and reduced clearance between the mirror plate and portions of the electrode structure. Based on this analysis, embodiments of the present invention provide micro-mirrors with flexible members that are thicker and shorter than comparable conventional designs.

In some embodiments of the present invention, the thickness of the hinge is equal to the thickness of the mirror plate. As described more fully in U.S. patent application Ser. No. 10/756,936, entitled Reflective Spatial Light Modulator, previously referenced, some embodiments of the present invention utilize a single continuous layer of silicon (e.g., single crystal silicon) to form the mirror plate and coplanar torsion spring hinge. Such a design is illustrated by mirror plate 230 in FIG. 2. Thus, embodiments of the present invention provide flexible members or hinges with a well defined thickness determined by semiconductor growth and processing parameters.

Accordingly, given a hinge thickness equal to the mirror plate thickness, embodiments of the present invention provide predetermined hinge widths and lengths to obtain a predetermined restoring force at contact locations. Increases in torsion spring hinge stiffness, however, are typically accompanied by increases in the electrostatic force needed to rotate the micro-mirror from an unactivated state to an activated state. Additionally, increases in torsion spring hinge stiffness may result in increased impact energy.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A spatial light modulator for use in display applications, the spatial light modulator comprising:
    a support substrate;
    a flexible member coupled to the support substrate;
    a mirror plate coupled to the flexible member and characterized by an activated position, wherein the flexible member is adapted such that the mirror plate is capable of rotating in relation to an axis of the flexible member from the activated position to a second position at an average angular rotation rate greater than 4.0°/μs.

2. The spatial light modulator of claim 1 wherein the mirror plate is capable of rotating from the activated position to the second position at an average angular rotation rate greater than 4.0°/μs free from an electrode voltage.

3. The spatial light modulator of claim 1 wherein the mirror plate is capable of rotating from the activated position to the second position at an average angular rotation rate greater than 6.0°/μs.

4. The spatial light modulator of claim 3 wherein the mirror plate is capable of rotating from the activated position to the second position at an average angular rotation rate greater than 12°/μs.

5. The spatial light modulator of claim 4 wherein the mirror plate is capable of rotating from the activated position to the second position at an average angular rotation rate greater than 24°/μs and less than 100°/μs.

6. The spatial light modulator of claim 1 wherein the mirror plate is characterized by a perimeter of less than 80 μm.

7. The spatial light modulator of claim 6 wherein the mirror plate is characterized by a perimeter of less than 50 μm.

8. The spatial light modulator of claim 1 wherein the flexible member is a torsion spring hinge.

9. The spatial light modulator of claim 1 wherein the support substrate comprises complementary electrodes associated with opposing portions of the mirror plate.

10. The spatial light modulator of claim 1 wherein the flexible member is aligned with a diagonal of the mirror plate.

11. The spatial light modulator of claim 10 wherein the axis of the flexible member is collinear with the diagonal of the mirror plate.

12. A spatial light modulator for use in display applications, the spatial light modulator comprising:
a support substrate;
a flexible member coupled to the support substrate;
a mirror plate coupled to the flexible member, wherein the flexible member is characterized by a torsional stiffness in a predetermined range from 10 μN-μm to 100 μN-μm.

13. The spatial light modulator of claim 12 wherein the flexible member is characterized by a torsional stiffness from 40 μN-μm to 100 μN-μm.

14. The spatial light modulator of claim 12 wherein the mirror plate is characterized by a perimeter of less than 80 μm.

15. The spatial light modulator of claim 14 wherein the mirror plate is characterized by a perimeter of less than 50 μm.

16. The spatial light modulator of claim 12 wherein the flexible member is a torsion spring hinge.

17. The spatial light modulator of claim 12 wherein the support substrate comprises complementary electrodes associated with opposing portions of the mirror plate.

18. The spatial light modulator of claim 12 wherein the flexible member is aligned with a diagonal of the mirror plate.

19. The spatial light modulator of claim 1 wherein the flexible member is characterized by a torsional stiffness in a predetermined range from 10 μN-μm to 100 μN-μm.

20. The spatial light modulator of claim 1 wherein the flexible member is characterized by a torsional stiffness in a predetermined range from 40 μN-μm to 100 μN-μm.

* * * * *